United States Patent
Hatakeyama

(10) Patent No.: US 10,056,421 B2
(45) Date of Patent: Aug. 21, 2018

(54) IMAGING DEVICE AND IMAGING METHOD

(71) Applicant: OLYMPUS CORPORATION, Hachioji-shi, Tokyo (JP)

(72) Inventor: Ryo Hatakeyama, Hino (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 15/479,021

(22) Filed: Apr. 4, 2017

(65) Prior Publication Data

US 2017/0310908 A1 Oct. 26, 2017

(30) Foreign Application Priority Data

Apr. 20, 2016 (JP) .................................. 2016-084493

(51) Int. Cl.
| | | |
|---|---|---|
| H01L 27/146 | (2006.01) | |
| H04N 5/232 | (2006.01) | |
| H04N 5/378 | (2011.01) | |
| H04N 9/04 | (2006.01) | |
| G02B 7/34 | (2006.01) | |

(52) U.S. Cl.
CPC .......... *H01L 27/14645* (2013.01); *G02B 7/34* (2013.01); *H01L 27/14621* (2013.01); *H01L 27/14627* (2013.01); *H04N 5/23212* (2013.01); *H04N 5/378* (2013.01); *H04N 9/045* (2013.01); *H04N 2209/045* (2013.01)

(58) Field of Classification Search
CPC ......... H01L 27/14645; H01L 27/14621; H01L 27/14627; H04N 5/23212; H04N 5/378; H04N 9/045; H04N 2209/045
See application file for complete search history.

(56) References Cited

U.S. PATENT DOCUMENTS

| | | | |
|---|---|---|---|
| 2015/0009383 A1* | 1/2015 | Fujii | ................. H01L 27/14627 348/302 |
| 2015/0316833 A1* | 11/2015 | Watanabe | .......... H04N 5/23212 348/345 |
| 2016/0127637 A1* | 5/2016 | Takao | ................. H04N 5/23212 348/208.12 |
| 2017/0034426 A1* | 2/2017 | Fukuda | ................. H04N 5/3572 |
| 2017/0272643 A1* | 9/2017 | Tamaki | ............... H04N 5/23212 |

FOREIGN PATENT DOCUMENTS

| | | |
|---|---|---|
| EP | 1 085 751 A2 | 3/2001 |
| JP | 2015-166799 | 9/2015 |

* cited by examiner

*Primary Examiner* — Nhan T Tran

(74) *Attorney, Agent, or Firm* — John C. Pokotylo; Pokotylo Patent Services

(57) ABSTRACT

An imaging device, comprising: a pixel group in which unit pixels including a plurality of pixels receiving light fluxes having passed through different pupil areas of a photographing lens are provided in a form of a matrix; a plurality of types of color filters with different spectral transmittances provided in correspondence with the unit pixels; a microlens provided in correspondence with the color filter; a color information detection circuit which detects subject color information; and a pixel signal readout circuit which reads out a focus detection signal from the pixel group and reads out only a signal of the unit pixel in correspondence with a color filter associated with subject color information detected by the color information detection circuit.

7 Claims, 14 Drawing Sheets

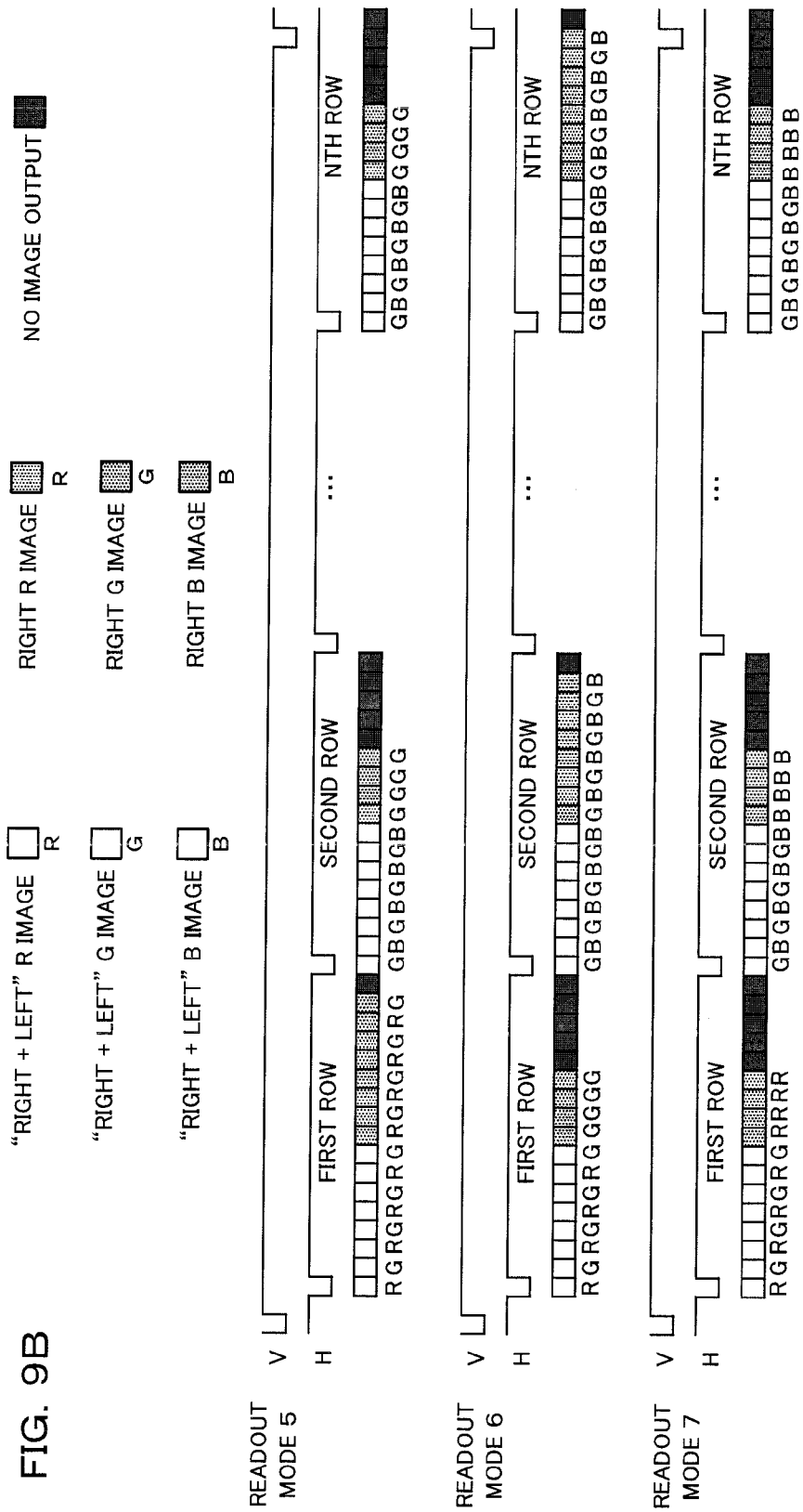

IMAGING DEVICE AND IMAGING METHOD

CROSS-REFERENCE TO RELATED APPLICATIONS

Benefit is claimed, under 35 U.S.C. § 119, to the filing date of prior Japanese Patent Application No. 2016-084493 filed on Apr. 20, 2016. This application is expressly incorporated herein by reference. The scope of the present invention is not limited to any requirements of the specific embodiments described in the application.

BACKGROUND OF THE INVENTION

1. Field of the Invention

The present invention relates to an imaging device such as a digital camera, and an imaging method, and in detail relates to an imaging device including an image sensor in which a plurality of photodiodes are provided for one microlens, and an imaging method.

2. Description of Related Art

Conventionally, in electronic device including an imaging function, such as a digital camera, an image sensor such as a CCD (Charged Coupled Device) image sensor and a CMOS (Complementary Metal Oxide Semiconductor) image sensor, is used.

A technique is known in which a microlens is provided in each individual pixel in an image sensor for focus detection, an area of each individual photodiode on which light is focused by the microlens is divided, and on the basis of a signal output from the divided area, phase difference-based focus detection is performed.

For example, the imaging device disclosed in Japanese patent laid-open No. 2001-083407 (hereinafter referred to as Patent Literature 1) is configured so that each photodiode receives light from different pupil planes of the imaging lens by dividing a photodiode in a pixel into two halves. By comparing the outputs of the two divided photodiodes, a focus state of an imaging lens is detected. Accordingly, it is possible for the imaging device to perform phase difference-based focus detection at the same time as performing a real-time display of a live view of an image taken in from the image sensor.

In the above-described technique to perform phase difference-based focus detection by providing a microlens on the image sensor plane, it is possible to improve the accuracy of focus detection by making use of more photodiode outputs. However, making use of more photodiode outputs increases the amount of data to be read out from the image sensor.

It is necessary for the imaging device to read out both the image data for display and the image data for phase difference detection when taking in the image from the image sensor real time. Accordingly, a difference between a period of readout from the image sensor and the time taken by the image sensor to read out an image, that is, a blanking period of time shortens and the operation time of the image sensor lengthens. As a result, electric power consumed by the image sensor increases and accordingly, the amount of heat generation also increases. In the image sensor such as a CMOS image sensor, there is a tendency for the noise level of the sensor to increase as temperature rises, and therefore, there is a possibility that the noise affects the photographed image. Further, for a mobile imaging device having a battery mounted thereon, an increase in power consumption causes a reduction in available time.

Therefore, in the imaging device disclosed in Japanese patent laid-open No. 2015-166799 (hereafter referred to as Patent Literature 2), the blanking period of time is increased by terminating readout of image data for phase difference detection to suppress power consumption when a detected temperature exceeds a threshold value, or when a detected battery remaining amount falls below a threshold value.

SUMMARY OF THE INVENTION

An imaging device according to a first aspect of the present invention comprises: a pixel group in which unit pixels including a plurality of pixels receiving light fluxes having passed through different pupil areas of a photographing lens are provided in a form of a matrix; a plurality of types of color filters with different spectral transmittances provided in correspondence with the unit pixels; a microlens provided in correspondence with the color filter; a color information detection circuit that detects subject color information; and a pixel signal readout circuit that reads out a focus detection signal from the pixel group and reads out only a signal of the unit pixel in correspondence with the color filter associated with the subject color information detected by the color information detection circuit.

An imaging method according to a second aspect of the present invention is an imaging method of an imaging device having a pixel group in which unit pixels including a plurality of pixels receiving light fluxes having passed through different pupil areas of a photographing lens are provided in a form of a matrix, a plurality of types of color filters with different spectral transmittances provided in correspondence with the unit pixels, and a microlens provided in correspondence with the color filter, and the method comprises: reading out a focus detection signal from the pixel group; detecting subject color information on the basis of the focus detection signal; and reading out only a signal of the unit pixel in correspondence with the color filter associated with the detected subject color information.

BRIEF DESCRIPTION OF THE DRAWINGS

FIG. 9A and FIG. 9B are timing charts showing a readout mode in the imaging device according to the first embodiment of the present invention.

DETAILED DESCRIPTION OF THE PREFERRED EMBODIMENTS

Figure 1:
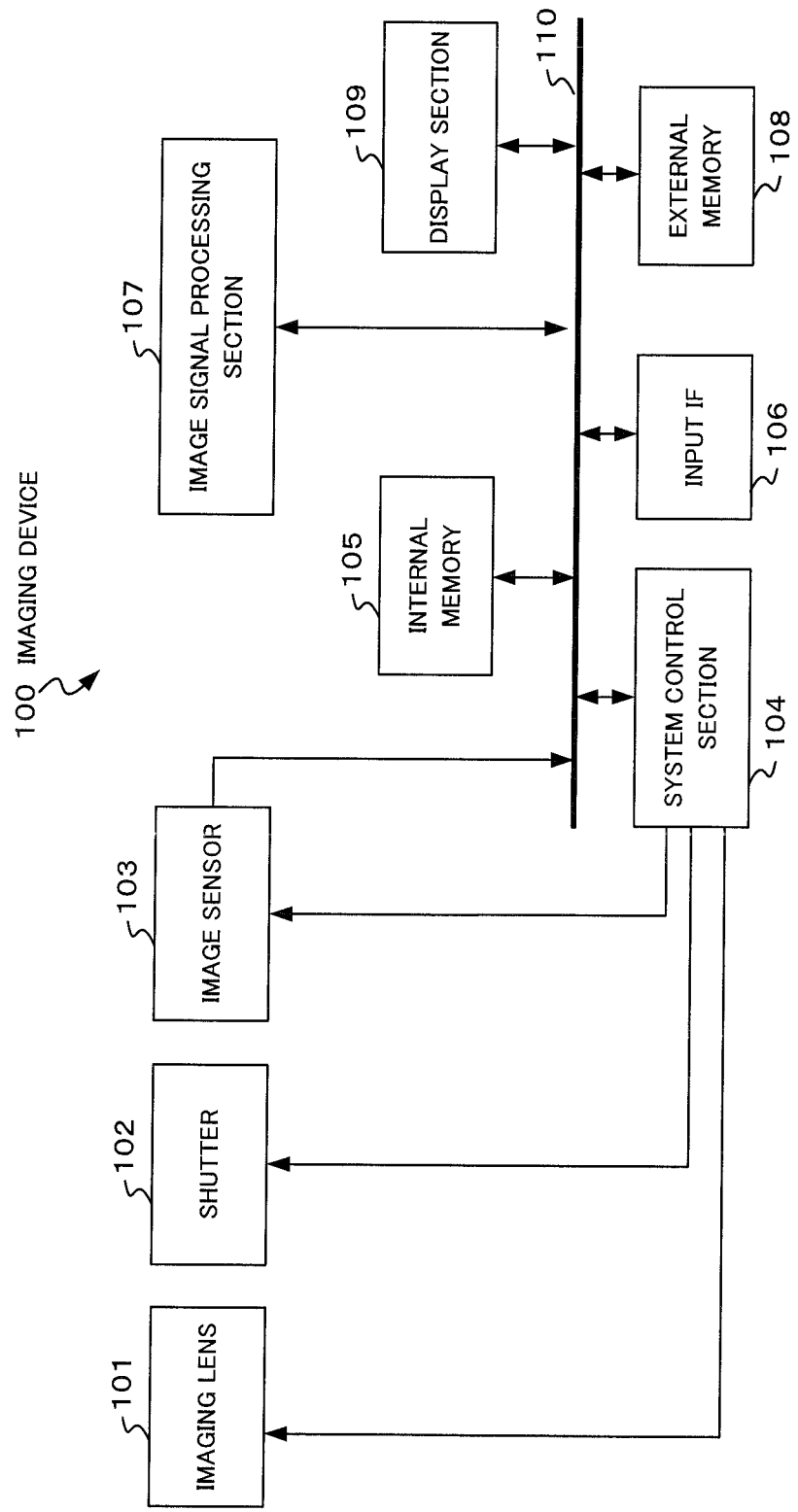
FIG. 1 is a block diagram mainly showing the electrical structure of an imaging device according to a first embodiment of the present invention.

Preferred embodiments of the present invention will be described in the following on the basis of the attached drawings. FIG. 1 is an outline configuration diagram of an imaging device 100 according to a first embodiment of the present invention. Note that an example of application to a digital camera as the imaging device will be described in the present embodiment.

An imaging lens 101 forms an optical image of a subject on an image sensor 103. The imaging lens 101 has a focus lens and a zoom lens and a system control section 104 performs zoom control and focus control. Further, in the imaging lens 101, an aperture is provided and the system control section 104 performs aperture control. Here, in the case where the imaging lens 101 is a single-focus lens, the zoom lens is omitted. Further, the aperture in the imaging lens 101 may be omitted and in this case, it may also be possible to perform exposure control only with the shutter speed, the ISO sensitivity and the like.

A shutter 102 is provided on the optical axis of the imaging lens 101. The shutter 102 includes a mechanical shutter and controls, in accordance with control from the system control section 104, passing (open state) and shielding of subject light having passed through the imaging lens 101. At the time of still image photographing, the exposure time is controlled by the shutter 102. At the time of moving image photographing and at the time of live-view display, the shutter 102 is brought into the open state.

The image sensor 103 is provided behind the shutter 102 and on the optical axis of the imaging lens 101. The image sensor 103 is a photoelectric conversion means including an image sensor such as a CMOS (Complementary Metal Oxide Semiconductor) image sensor and a CCD (Charge Coupled Device) sensor. In the image sensor 103, pixels (having photodiode) are provided in the form of a matrix and each pixel accumulates a pixel signal in accordance with the amount of received light.

The image sensor 103 is provided with an imaging control circuit therein and the imaging control circuit performs exposure control and readout control of a pixel signal in accordance with instructions from the system control section 104 (see imaging drive control section 607 in FIG. 6 described below). The read-out pixel signal is output to a bus 110. Therefore, the image sensor 103 subjects a subject image formed by an imaging optical system including the imaging lens 101 and the shutter 102 to photoelectric conversion and outputs an image signal. The detailed structure of the image sensor 103 will be described below referring to FIG. 2 to FIG. 4.

The system control section 104 includes a CPU (Central Processing Unit) and its peripheral circuits and controls the imaging lens 101, the shutter 102, and the image sensor 103 described previously and controls other blocks in accordance with programs stored in an internal memory 105. For example, the system control section 104 has a function as an imaging control section that controls the amount of exposure in photographing and controls imaging timing, and a part of an A/D conversion control section. The system control section 104 centralizedly controls the imaging device 100.

The internal memory 105 has an electrically rewritable nonvolatile memory such as a flash memory, and an electrically rewritable volatile memory such as an SDRAM (Synchronous Dynamic Random Access Memory) and a DRAM (Dynamic Random Access Memory). The internal memory 105 temporarily stores, for example, various setting information required for camera operation, and currently being processed image data at the time of image processing, in addition to the above-described programs.

An external memory 108 is a storage medium that can be attached to the imaging device 100, such as an SD card and a CF card, and has an electrically rewritable nonvolatile memory. The external memory 108 stores image data that has been subjected to development processing by an image signal processing section 107 and enables data transfer to the outside the imaging device.

A display section 109 has a monitor such as TFT (Thin Film Transistor) liquid crystal and organic EL (Electro Luminescence), and the monitor is provided at the rear or the like of the main body and/or provided at a position where observation is possible via an eyepiece section (EVF (Electronic View Finder)). The display section 109 displays images developed by the image signal processing section 107, such as a live-view image and a playback image of an already stored image. Further, the display section 109 also displays a menu screen and the like for a photographer to set the imaging device 100.

An input IF (Interface) 106 has various operation members such as a power switch, a release button, and a mode setting dial, a detection section that detects operation states of the various operation members, a touch panel that detects an operation state of the display section 109 to the monitor and the like. The input IF 106 performs various mode settings and gives instructions to perform photographing operation such as release on the basis of the operation of a photographer.

The image signal processing section 107 has an image signal processing circuit. The image signal processing section 107 performs various basic image processing such as noise processing, WB (white Balance) gain correction, synchronization processing, and contour enhancement, for image data on the basis of the pixel signal read out from the image sensor 103. Furthermore, the image signal processing section 107 extracts a pixel signal from a phase difference pixel and detects a defocus amount (including defocus direction) of the imaging lens 101 using the phase difference detection method. Moreover, the image signal processing section 107 detects color information on the basis of the pixel signal of the image sensor 103. The detailed configuration of the image signal processing section 107 will be described below referring to FIG. 6.

Next, referring to FIG. 2, the detailed configuration of the image sensor 103 will be described. A pixel array section 201 has provided therein tens to thousands of unit pixels in each row and each column. In each pixel, a photodiode, a capacitor and the like are provided and each pixel subjects a subject image formed by the imaging lens 101 to photoelectric conversion and accumulates pixel signals. The pixel array section 201 functions as a pixel group in which unit pixels including a plurality of pixels receiving light fluxes having passed through different pupil areas of the imaging lens are provided in the form of a matrix.

A horizontal scan section 205 has a horizontal scan circuit and the circuit has a horizontal address setting section that controls column address and column scan for the pixel array section 201, a horizontal drive section and the like. A vertical scan section 202 has a vertical scan circuit and the circuit has a vertical address setting section that controls row address and row scan, a vertical drive section and the like. A communication IF section 204 has a clock conversion function that receives a master clock from the outside of the image sensor 103 and generates an internal clock, and a function that receives data that specifies the operation mode and the like supplied from the main control section (in the present embodiment, the system control section 104 of the imaging device 101) located outside the image sensor 103 and controls each section. The horizontal scan section 205 and the vertical scan section 202 read out a pixel signal from each pixel within the pixel array section 201 and outputs to a column AD conversion section 203.

The column AD conversion section 203 has an AD conversion circuit and AD-converts an analog pixel signal output from the pixel array section 201 into a digital signal. The column AD conversion section 203 has a comparison section that compares a reference signal with a pixel signal output from the pixel array section 201, a memory that accumulates signals, a gain amplifier, a switch section that switches between transferring and not transferring an AD conversion result and the like.

A video data conversion section 206 has a digital calculation section that performs various digital calculation processing on a signal output from the column AD conversion section 203 and an interface section that performs an interface function with the outside. Image data is output to the outside of the image sensor 103 via the video data conversion section 206.

Figure 3:
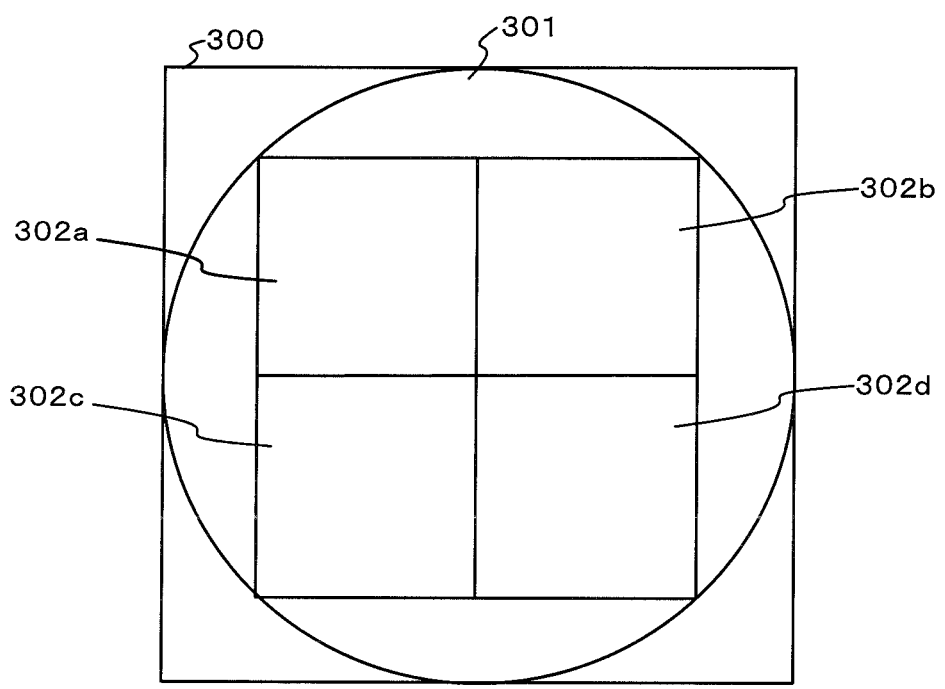
FIG. 3 is a plan view showing the configuration of one pixel in the image sensor in the imaging device according to the first embodiment of the present invention.

Next, referring to FIG. 3, the pixel of the image sensor 103 will be described. In the image sensor 103, a large number of pixels are provided in the form of a matrix and FIG. 3 shows a configuration of one pixel thereof. One pixel 300 has a microlens 301 and four photodiodes (hereinafter, referred to as "PD") 302a to 302d are provided below the microlens 301. Note that, in FIG. 3, the example in which the four PDs are provided is shown, but the number of PDs needs to be two or more and for example, the number of PDs may be two, nine and the like.

In the example shown in FIG. 3, it may also be possible to select and add a plurality of photodiode outputs. For example, it may also be possible to add the PD outputs of the PD 302a and the PD 302c and to add the PD outputs of the PD 302b and the PD 302d, and then to take each of the sums to be two outputs, or to add the PD outputs of the PD 302a and the PD 302b and to add the PD outputs of the PD 302c and the PD 302d, and then to take each of the sums to be two outputs. In this case, it is sufficient to output after adding image signals by analog calculation. Further, it may also be possible to add each of the PD outputs of the PD 302a, the PD 302b, the PD 302c, and the PD 302d and then outputs the sum. In this case, it is sufficient to add digitally after AD conversion.

Note that the pixel 300 includes, in addition to the components shown schematically, for example, a pixel amplifying amplifier for amplification at the time of reading out a signal of the PD into the column AD conversion section 203, a selection switch that selects a row, a reset switch that resets a signal of the PD and the like.

Figure 4:
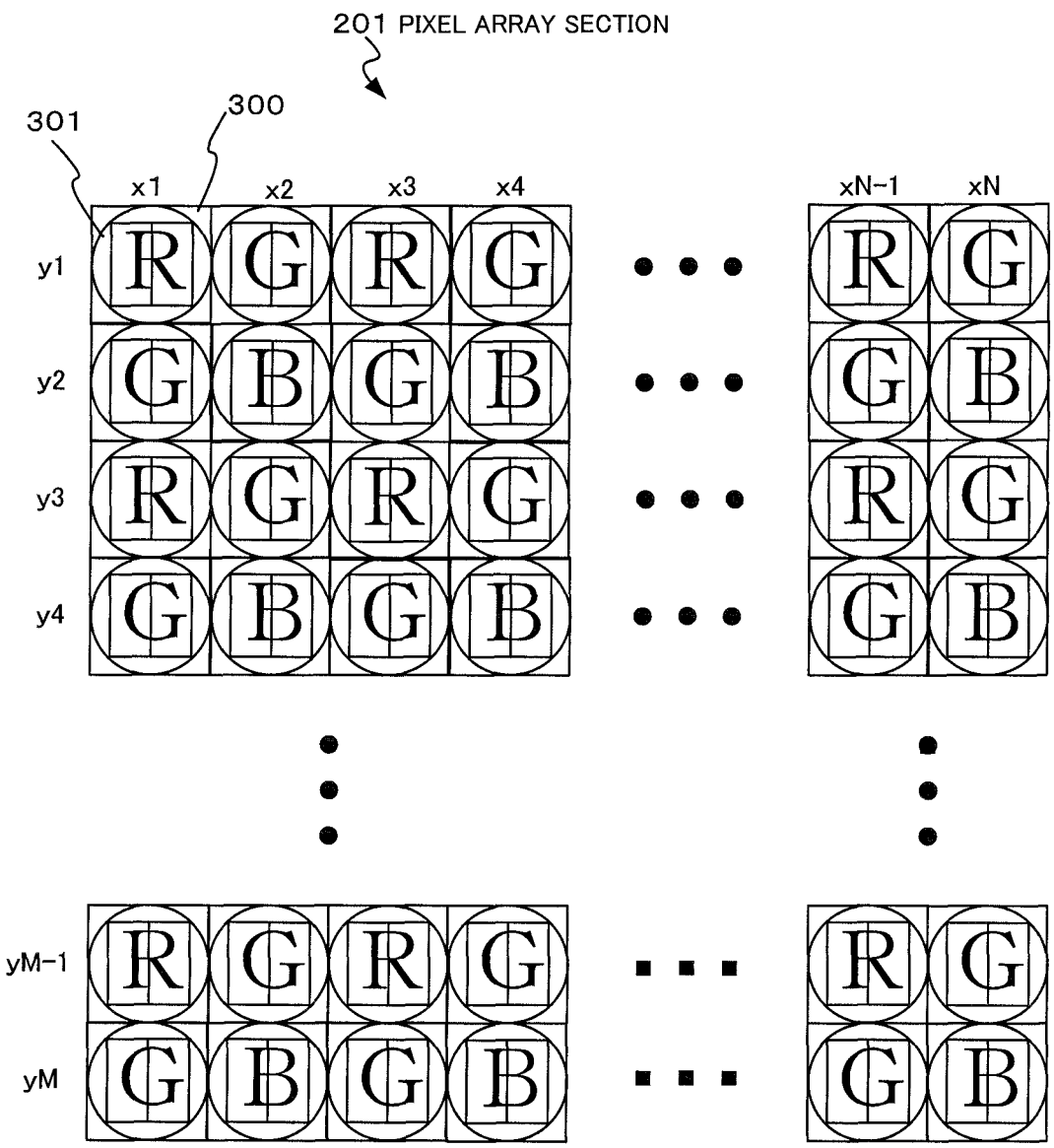
FIG. 4 is a plan view showing a pixel array in the image sensor in the imaging device according to the first embodiment of the present invention.

Next, referring to FIG. 4, the pixel array in the pixel array section 201 of the image sensor 103 will be described. As shown in FIG. 4, the pixel array section 201 arrays a plurality of pixels, that is, N pixels in the horizontal direction and M pixels in the vertical direction in the form of a two-dimensional array, and in each pixel, a color filter 310 (see FIG. 5) is provided. In the present embodiment, the color filter 310 employs a Bayer array and in an odd-numbered row (each row of y1, y3, y5, . . . ), red (R) and green (G) filters are provided repeatedly and in an even-numbered row (each row of y2, y4, y6, . . . ), green (G) and blue (B) color filters are provided repeatedly. Note that, in the example shown in FIG. 4, two PDs are provided for one microlens 301. Moreover, although the color filter employs a Bayer array, another array scheme may be employed.

Figure 5:
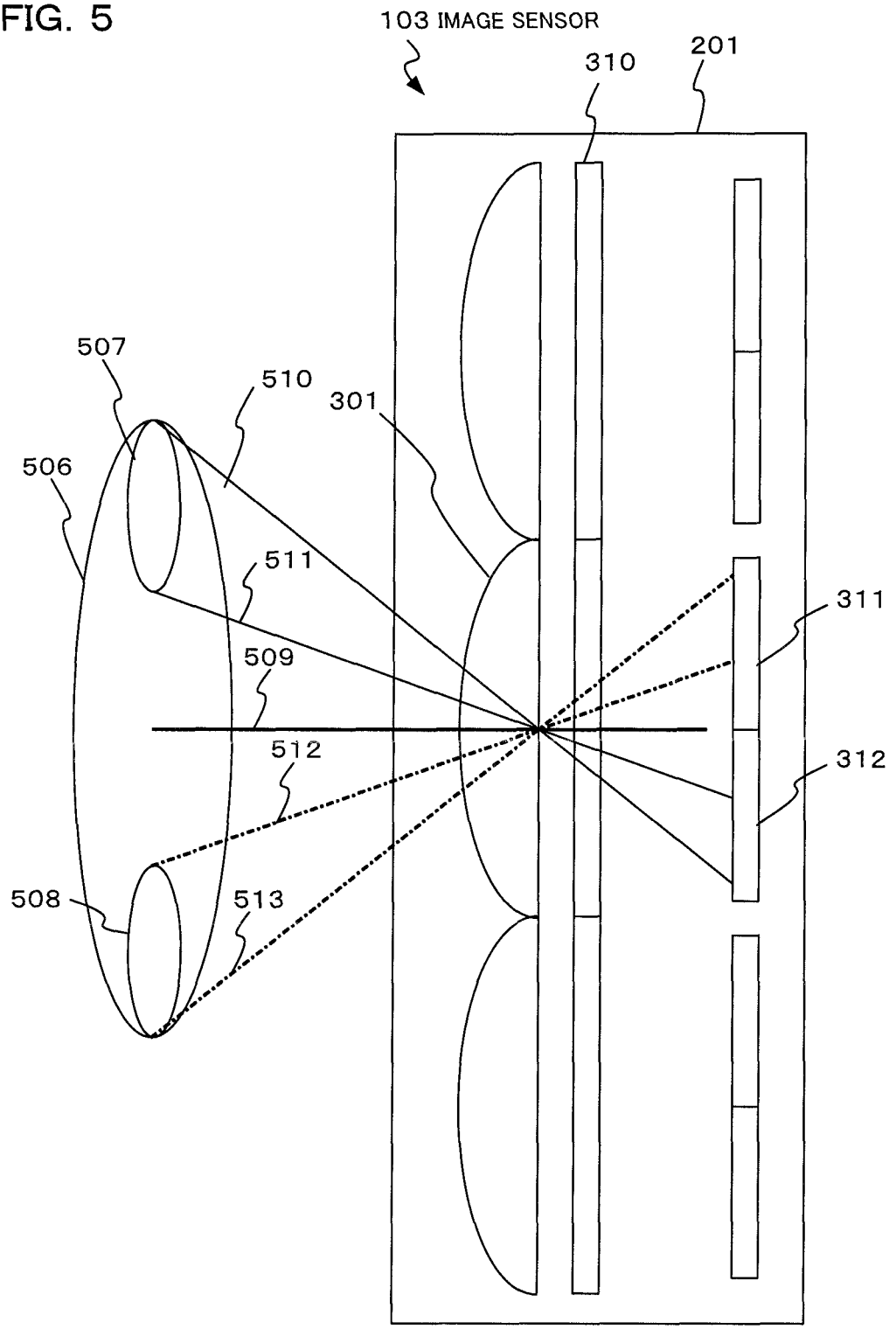
FIG. 5 is a schematic diagram for describing an optical system for performing a phase difference scheme in the imaging device according to the first embodiment of the present invention.

Next, referring to FIG. 5, the optical system for performing phase difference detection and the image sensor will be described. FIG. 5 is a conceptual diagram in which a light flux emitted from the emission pupil of the imaging lens 101 enters the image sensor 103, showing a schematic cross section of three pixels of the pixel array section 201.

Each pixel of the pixel array section 201 is provided with the microlens 301, the color filter 310, and photodiodes (PDs) 311 and 312. Note that the color filter 310 includes each color filter of RGB in accordance with the Bayer array described in FIG. 4. The microlens 301 functions as microlens provided in correspondence with a color filter. Moreover, the color filter 310 functions as a plurality of types of color filters with different spectral transmittances provided in correspondence with the unit pixel. Each of the PD 311 and the PD 312 corresponds to the PD 302a and the PD 302b shown in FIG. 3.

In FIG. 5, symbol 506 indicates the emission pupil of the imaging lens 101. Here, it is assumed that the center of the light flux emitted from the emission pupil 506 to the pixel that has the microlens 301 is an optical axis 509. The light emitted from the emission pupil 506 enters the image sensor 103 with the optical axis 509 being the center. Reference numerals 507 and 508 indicate partial areas of the emission pupil of the imaging lens 101. Light beams at the outermost circumference of the light passing through the partial area 507 of the emission pupil 506 are indicated by 510 and 511, and light beams at the outermost circumference of the light passing through the partial area 508 of the emission pupil 506 are indicated by 512 and 513.

As can be seen in FIG. 5, of the light flux emitted from the emission pupil 506, the light flux on the upper side with the optical axis 509 as a boundary enters the PD 312 and the light flux on the lower side enters the PD 311. That is, each of the PD 311 and the PD 312 receives light from different areas of the emission pupil 506 of the imaging lens 101. By making use of the characteristics, it is possible to acquire at least two images with parallax. Image data obtained from the plurality of PDs on the right side is called a right image and image data obtained from the plurality of PDs on the left side is called a left image. At this time, by performing phase difference detection using one line of the right image and one line at the corresponding position of the left image, it is possible to implement a phase difference autofocus.

In the present embodiment, the image obtained by adding all the plurality of PDs is taken to be a "right+left" image and the image data obtained from the plurality of PDs on the right side is taken to be a right image and thus the phase difference autofocus is implemented. In this case, from a difference between the "right+left" image and the right image, two images, that is, the right image and the left image are generated and by using the right image and the left image, the phase difference detection is performed. Even in the case where the acquisition of the right image of a certain color is terminated, by acquiring the "right+left" image, it is possible to obtain a display image at all times.

Next, referring to FIG. 6, the detailed configuration of the image signal processing section 107 will be described. The image signal processing section 107 has a "right+left" image extraction section 601, a right image extraction section 602, a left image extraction section 603, a development processing section 604, a phase difference detection section 605, and a color information detection section 606. All or a part of these sections may include hardware circuits. That is, all or a part of these sections may include a "right+left" image extraction circuit, a right image extraction circuit, a left image generation circuit, a development processing circuit, a phase difference detection circuit, a color information detection circuit and the like.

Figure 2:
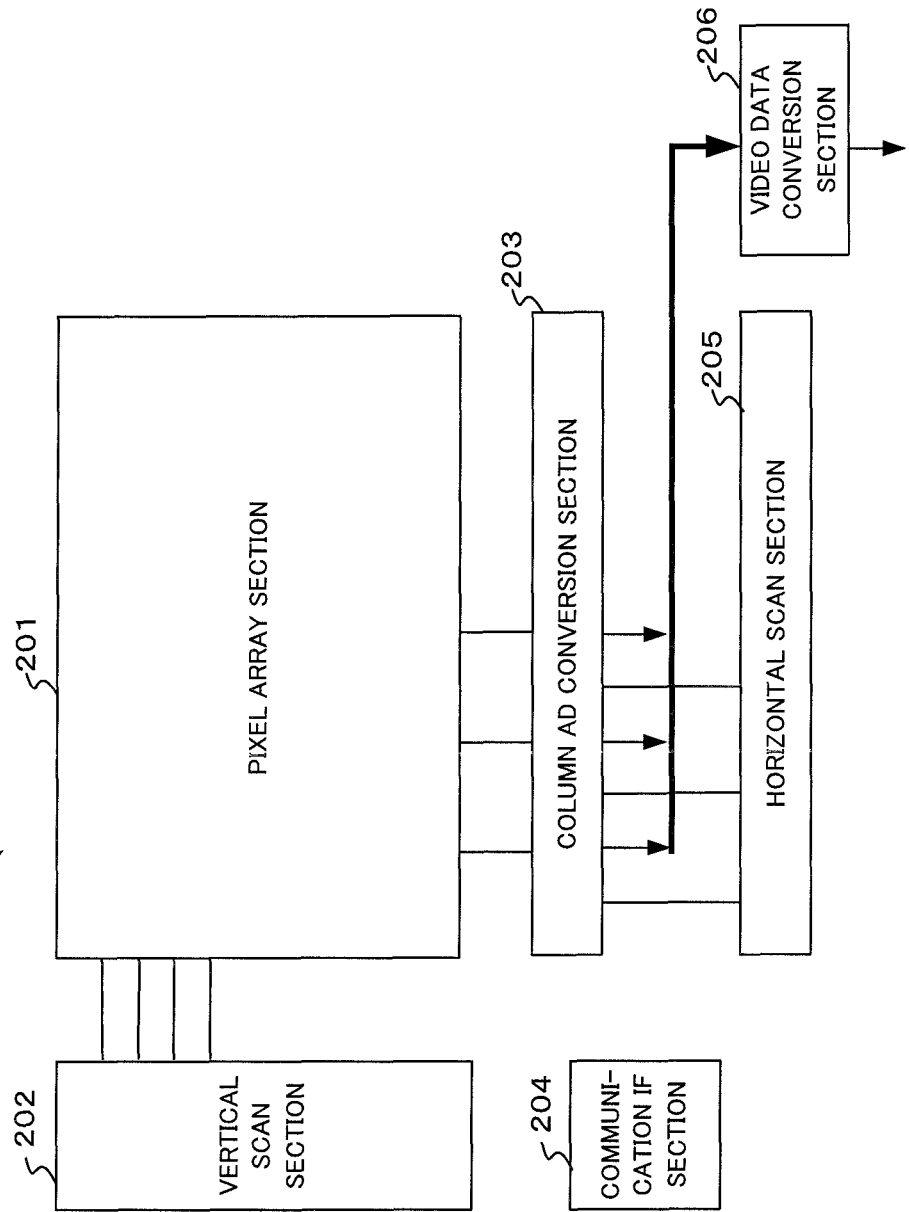
FIG. 2 is a block diagram mainly showing the electrical structure of an image sensor in the imaging device according to the first embodiment of the present invention.

As described referring to FIG. 2 to FIG. 4, the image sensor 103 has the PDs for detecting the right image and the left image, respectively. At the time of reading out the pixel signal from each PD from the image sensor 103, a signal obtained by adding the pixel signals of the right image and the left image, and a signal of only the pixel of the right image are output in a predetermined order.

The "right+left" image extraction section 601 inputs the "right+left" image and the right image output from the image sensor 103 via the data bus 110 and the internal memory 105, extracts only the "right+left" image from the input images, and outputs the extracted "right+left" image. That is, the "right+left" image extraction section 601 extracts the signal at timing at which the signal obtained by adding the pixel signal of the "right+left" image because the signal obtained by adding the pixel signals of the right image and the left image and the signal of only the pixel of the right image are output in a predetermined order.

The right image extraction section 602 inputs the "right+left" image and the right image output from the image sensor 103 via the data bus 110 and the internal memory 105, extracts only the right image from the input images, and outputs the extracted right image. That is, the right image extraction section 602 extracts the signal at timing at which the pixel signal of the pixel of the right image is output.

The left image extraction section 603 extracts only the left image from the "right+left" image and the right image received via the data bus 110 and the internal memory 105, and outputs the left image. By subtracting the right image output by the right image extraction section 602 from the "right+left" image output by the "right+left" image extraction section 601, it is possible to extract only the left image.

The development processing section 604 inputs the "right+left" image output by the "right+left" image extraction section 601, and performs processing such as white balance, color interpolation, color correction, y conversion, edge enhancement, resolution conversion, image compression and the like of the digital image data. By using the image data processed by the development processing section 604, a live-view display is produced and a still image and stored images of a moving image are generated.

The phase difference detection section 605 detects a phase difference (defocus amount) in accordance with the well-known phase difference detection method using the right image output by the right image extraction section 602 and the left image output by the left image extraction section 603. The detected phase difference (defocus amount) is output to the system control section 104 and the system control section 104 performs focus control of the imaging lens 101 on the basis of the phase difference.

The color information detection section 606 inputs the "right+left" image output by the "right+left" image extraction section 601, calculates an output value for each color within the area on the specified image, and outputs the calculation result to an imaging drive control section 607 within the system control section 104 via the data bus 110 and the internal memory 105. The "right+left" image is the pixel signals of RGB to be read out in a predetermined order, and therefore, in accordance with this order, the pixel signals are separated into pixel signals of only R, those of only G, and those of only B. After the pixel signals of RGB are separated, the pixel outputs are averaged for each area and for each color and it is detected which of the conditions described below the average belongs to. The conditions will be described below using S5 in FIG. 7 and FIG. 8. The color information detection section 606 functions as a color information detection circuit that detects subject color information.

The imaging drive control section 607 sends a command to switch the imaging drive modes to the image sensor 103 on the basis of the detection result received from the color information detection section 606. The imaging drive mode will be described below referring to FIG. 7. The imaging drive control section 607 functions as a pixel signal readout circuit that reads out a focus detection signal from the pixel group and reads out only a signal of the unit pixel in correspondence with the color filter associated with the subject color information detected by the color information detection circuit. The pixel signal readout section reads out only the signal of the above-described unit pixel in correspondence with the color filter associated with the subject color information detected by the color information detection section.

Moreover, the pixel signal readout circuit reads out the pixel signal and the focus detection signal from the pixel group and reads out the signal of the unit pixel in correspondence with the color filter associated with the image signal and the subject color information detected by the color information detection circuit. The pixel signal readout circuit reads out all the signals of a plurality of pixels from the unit pixel as image signals and when reading out the focus detection signal, reads out only the signal of the unit pixel in correspondence with the color filter associated with the color information of the subject detected by the color information detection circuit (see FIG. 8).

Next, referring to the flowcharts shown in FIG. 7 and FIG. 8, the live-view operation will be described. The flow is implemented by the CPU within the system control section 104 controlling each section within the imaging device 100 on the basis of the programs stored in the internal memory 105.

Figure 7:
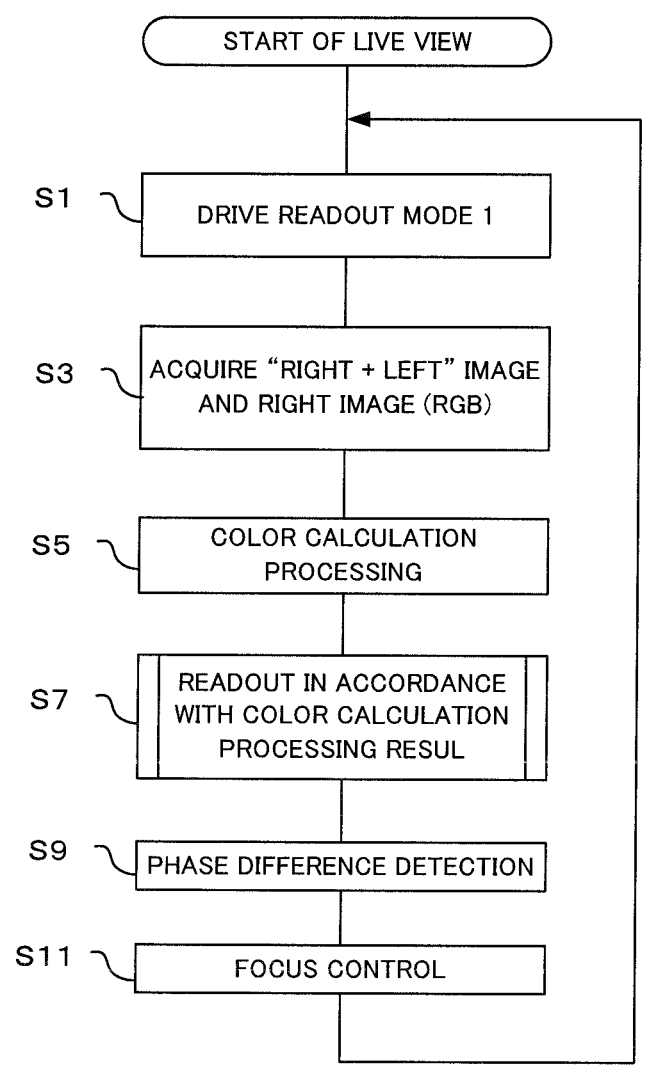
FIG. 7 is a flowchart showing a live-view operation of the imaging device according to the first embodiment of the present invention.
Figure 9A:
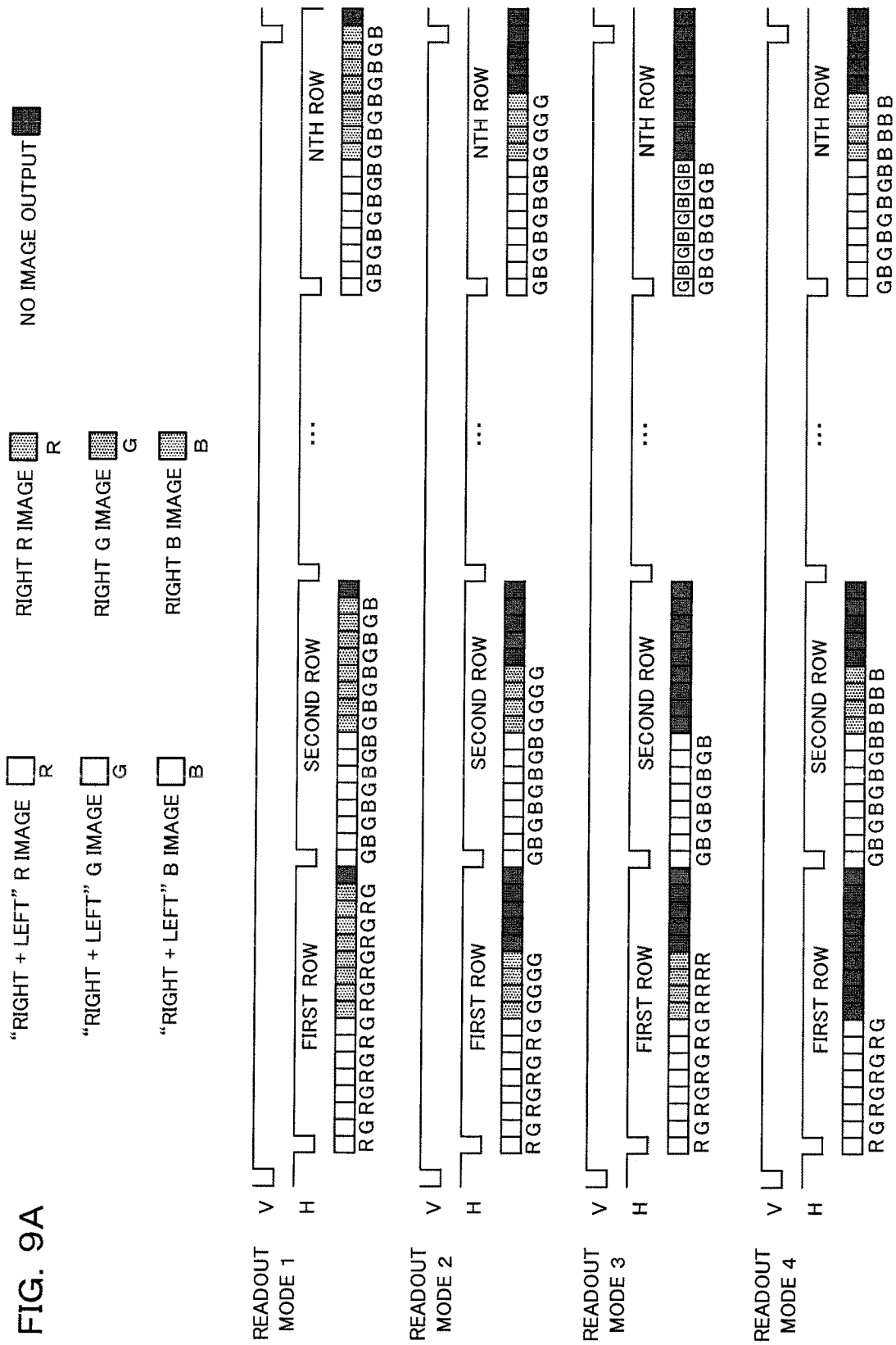

The flow shown in FIG. 7 assumes the state where the power of the imaging device 100 is turned on and the live-view control is started as the initial state. When the flow of the live view starts, a readout mode 1 is first driven (S1). The readout mode 1 is a mode of outputting the "right+left"

image and the right image (RGB) from the image sensor 103 in response to the timing signal (V signal in FIG. 9A and FIG. 9B) from the vertical scan section 202 and the timing signal (H signal in FIG. 9A and FIG. 9B) from the horizontal scan section 205. The readout mode 1 is shown at the uppermost portion in FIG. 9A.

The pixels of the image sensor 103 are provided so that the R pixel and the G pixel are provided alternately in odd-numbered rows (for example, the first row (see y1)) and the G pixel and the B pixel are provided alternately in even-numbered rows (for example, the second row (see y2)) as shown in FIG. 4. In the readout mode 1, in the case of reading out the first row, in accordance with the timing signal from the horizontal scan section 205, the pixel signals of the "right+left" image of the R pixel and the G pixel are first read out and then the pixel signal of the right image of the R pixel and the G pixel are read out. In the case of reading out the second row, in accordance with the timing signal from the horizontal scan section 205, the pixel signal of the "right+left" image of the G pixel and the B pixel are first read out and then the pixel signals of the right image of the G pixel and the B pixel are read out. Thereafter, the pixel signals are read out alternately. That is, the readout mode 1 performs an operation of reading out the pixel signals of the "right+left" image and the pixel signals of the right image successively from the first row up to the Nth row for each pixel of one row (line) in the image sensor 103 in accordance with the timing signal (H signal in FIG. 9A and FIG. 9B) from the horizontal scan section 205.

After the image sensor 103 is driven in the readout mode 1 at step S1, the "right+left" image and the right image (RGB) are acquired next (S3). Here, the pixel signals of the "right+left" image and the pixel signals of the right image read out in the readout mode 1 at step S1 are acquired via the data bus 110 and stored in the internal memory 105.

After the "right+left" image and the right image are acquired at step S3, color calculation processing is performed next (S5). Here, the color information detection section 606 first detects the color of each area using the pixel signals of the "right+left" image. In this detection, as described previously, the colors (for example, R, G, B) are separated into each color in the "right+left" image and the pixel outputs for each color in a fixed area (for example, AF (autofocus) calculation area) are averaged. Note that, in addition to the averaging calculation, an added value of pixels within the area or the most frequently output pixel value may be used.

After the color information detection section calculates the pixel output for each color for each area, on the basis of the value, which of the conditions 1 to 6 is satisfied is determined (there is a case where none of the conditions 1 to 6 is satisfied). According to this condition, it is determined which of the colors (R, G, B) is predominant in each area. When determining which of the colors (R, G, B) is predominant, the color whose average value of the pixel outputs for each color falls within a range larger than a threshold value 1 and smaller than a second threshold value 2 is determined to be predominant (provided that the threshold value 1 and the second threshold value 2 satisfy a relationship of threshold value 1<threshold value 2). The reason is that if the pixel value is too small, the pixel is dark and not appropriate for phase detection and if the pixel value is too large, the pixel is bright and not appropriate for phase detection. Note that, when determining which of the colors is predominant or not, there is a case where two or three colors are determined to be predominant, without being limited to one color.

After the color calculation processing is performed at step S5, the image drive control section 607 reads out in accordance with the color calculation processing result is performed next (S7). Here, the readout mode of the image sensor 103 is set in accordance with the condition of the conditions 1 to 6 determined at step S5 and the read-out pixel signals are stored in the internal memory 105.

The setting of the readout mode differs in accordance with which of the colors is predominant as the result of the color calculation processing. For the area in which the R pixel (red) is predominant, the phase difference detection is performed using the R pixel of the right image and the left image, and therefore, the readout of the R pixel of the right image is performed, but the readout of the G pixel and the B pixel is not performed. Similarly, for the area in which the G pixel (green) is predominant, the phase difference detection is performed using the G pixel of the right image and the left image, and therefore, the readout of the G pixel of the right image is performed, but the readout of the R pixel and the B pixel is not performed. Similarly, for the area in which the B pixel (blue) is predominant, the phase difference detection is performed using the B pixel of the right image and the left image, and therefore, the readout of the B pixel of the right image is performed, but the readout of the R pixel and the G pixel is not performed.

For the area in which two or more color pixels are predominant, the phase difference detection is performed using the predominant pixels, and therefore, the readout of the two color pixels is performed from the right image and the readout of the other color pixel is not performed. For the area in which the three color pixels are predominant, the phase difference detection is performed using the three color pixels from the right image.

The detailed operation of the readout in accordance with the color calculation processing result at step S7 will be described below referring to FIG. 8.

After the readout in accordance with the color calculation processing result is performed at step S7, the phase difference detection is performed next (S9). Here, the phase difference detection section 605 inputs the pixel signal of the right image from the right image extraction section 602, and further inputs the pixel signal of the left image from the left image extraction section 603, and performs the well-known phase difference detection using both the pixel signals.

After the phase difference detection is performed at step S9, the focus control is performed next (S11). Here, the system control section 104 calculates the focus control amount of the imaging lens 101 on the basis of the phase difference detected at step S9 and performs the focus control. When the focus control is completed, the processing advances to step S1 and the series of processing is repeated. That is, the pixel signal is read out at a predetermined frame rate from the image sensor 103, and therefore, the processing at steps S5 to S11 is repeated in accordance with the frame rate. Furthermore, although not described in the flow in FIG. 7, the "right+left" image" is read out in any of the readout modes 1 to 7, and therefore, each time the pixel signal is read out, the live-view display is updated using the "right+left" image.

Next, referring to the flowchart shown in FIG. 8, the readout operation in accordance with the color calculation processing result at step S7 will be described. Upon entering the flow, the flow first branches in accordance with which of the conditions determined at step S5 the average value belongs to.

The conditions at the time of the determination at step S5 are as follows. Here, $R_{AVE}$ is the average value of the pixel outputs for each area of the R pixel, $G_{AVE}$ is the average value of the pixel outputs for each area of the G pixel, and $B_{AVE}$ is the average value of the pixel outputs for each area of the B pixel. Further, there is a relationship of the threshold value 1<the threshold value 2 (see FIG. 10).

(Condition 1)
In the case where
$G_{AVE}$>threshold value 1 and $G_{AVE}$<threshold value 2 and
$R_{AVE}$<threshold value 1 or $R_{AVE}$>threshold value 2 and
$B_{AVE}$<threshold value 1 or $B_{AVE}$>threshold value 2
are satisfied, the processing advances to step S21 (condition 1).

(Condition 2)
In the case where
$G_{AVE}$<threshold value 1 or $G_{AVE}$>threshold value 2 and
$R_{AVE}$>threshold value 1 and $R_{AVE}$<threshold value 2 and
$B_{AVE}$<threshold value 1 or $B_{AVE}$>threshold value 2
are satisfied, the processing advances to step S25 (condition 2).

(Condition 3)
In the case where
$G_{AVE}$<threshold value 1 or $G_{AVE}$>threshold value 2 and
$R_{AVE}$<threshold value 1 or $R_{AVE}$>threshold value 2 and
$B_{AVE}$>threshold value 1 and $B_{AVE}$<threshold value 2
are satisfied, the processing advances to step S29 (condition 3).

(Condition 4)
In the case where
$G_{AVE}$>threshold value 1 and $G_{AVE}$<threshold value 2 and
$R_{AVE}$>threshold value 1 and $R_{AVE}$<threshold value 2 and
$B_{AVE}$<threshold value 1 or $B_{AVE}$>threshold value 2
are satisfied, the processing advances to step S33 (condition 4).

(Condition 5)
In the case where
$G_{AVE}$>threshold value 1 and $G_{AVE}$<threshold value 2 and
$R_{AVE}$<threshold value 1 or $R_{AVE}$>threshold value 2 and
$B_{AVE}$>threshold value 1 and $B_{AVE}$<threshold value 2
are satisfied, the processing advances to step S37 (condition 5).

(Condition 6)
In the case where
$G_{AVE}$<threshold value 1 or $G_{AVE}$>threshold value 2 and
$R_{AVE}$>threshold value 1 and $R_{AVE}$<threshold value 2 and
$B_{AVE}$>threshold value 1 and $B_{AVE}$<threshold value 2
are satisfied, the processing advances to step S41 (condition 6).

In the case where none of the above-described conditions 1 to 6 is satisfied, the processing advances to step S45.

In the case where the condition 1 is satisfied, the readout mode 2 is driven (S21) and the pixel signals of the G pixels of the "right+left" image and the right image are acquired (S23). In the case where the condition 1 is satisfied, G (green) is predominant as the subject color information, and therefore, the phase difference detection is performed using the G pixel. Consequently, when reading out the pixels of the image sensor 103, as described at the second portion in FIG. 9A, in the odd-numbered rows (for example, the first row), the R pixels and the G pixels of the "right+left" image are read out and subsequently, the G pixels of the right image are read out. Then, in the even-numbered rows (for example, the second row), the G pixels and the B pixels of the "right+left" image are read out and then the G pixels of the right image are read out. The read-out pixel signals are stored in the internal memory 105. That is, the readout mode 2 performs an operation of reading out the pixel signals of the "right+left" image and only the pixel signals of the G pixels of the right image for each pixel in one row (line) in the image sensor 103 from the first row to the Nth row successively in accordance with the timing signal (H signal in FIG. 9A) from the horizontal scan section 205.

In the case where the condition 2 is satisfied, the readout mode 3 is driven (S25) and the pixel signals of the R pixels of the "right+left" image and the right image are acquired (S27). In the case where the condition 2 is satisfied, R (red) is predominant as the subject color information, and therefore, the phase difference detection is performed using the R pixel. Consequently, when reading out the pixels of the image sensor 103, as described at the third portion in FIG. 9A, in the odd-numbered rows (for example, the first row), the R pixels and the G pixels of the "right+left" image are read out and subsequently, the R pixels of the right image are read out. Then, in the even-numbered rows (for example, the second row), the G pixels and the B pixels of the "right+left" image are read out but the readout is not performed from the pixels of the right image. That is, the readout mode 3 performs an operation of reading out the pixel signals of the "right+left" image and the pixel signals of the R pixels of the right image only for the rows (lines) in which the R pixel exists in one row (line) for each pixel in one row (line) in the image sensor 103 from the first row to the Nth row successively in accordance with the timing signal (H signal in FIG. 9A) from the horizontal scan section 205. The read-out pixel signals are stored in the internal memory 105.

In the case where the condition 3 is satisfied, the readout mode 4 is driven (S29) and the pixel signals of the B pixels of the "right+left" image and the right image are acquired (S31). In the case where the condition 3 is satisfied, B (blue) is predominant as the subject color information, and therefore, the phase difference detection is performed using the B pixel. Consequently, when reading out the pixels of the image sensor 103, as described at the fourth portion in FIG. 9A, in the odd-numbered rows (for example, the first row), the R pixels and the G pixels of the "right+left" image are read out and the readout of the pixels of the right image is not performed. Then, in the even-numbered rows (for example, the second row), the G pixels and the B pixels of the "right+left" image are read out and the B pixels of the right image are read out. That is, the readout mode 4 performs an operation of reading out the pixel signals of the "right+left" image and the pixel signals of the B pixels of the right image only for the rows (lines) in which the B pixel exists in one row (line) for each pixel in one row (line) in the image sensor 103 from the first row to the Nth row successively in accordance with the timing signal (H signal in FIG. 9A) from the horizontal scan section 205. The read-out pixel signals are stored in the internal memory 105.

In the case where the condition 4 is satisfied, the readout mode 5 is driven (S33) and the pixel signals of the G pixels and the R pixels of the "right+left" image and the right image are acquired (S35). In the case where the condition 4 is satisfied, G (green) and R (red) are predominant as the subject color information, and therefore, the phase difference detection is performed using the G pixel and the R pixel. Consequently, when reading out the pixels of the image sensor 103, as described at the first portion in FIG. 9B, in the odd-numbered rows (for example, the first row), the R pixels and the G pixels of the "right+left" image are read out and subsequently, the R pixels and the G pixels of the right image are read out. Then, in the even-numbered rows (for example, the second row), the G pixels and the B pixels of the "right+left" image are read out and the G pixels of the right image are read out. That is, the readout mode 5 performs an operation of reading out the pixel signals of the "right+left" image and the pixel signals of the R pixels of the right image and the G pixels of the right image for each pixel in one row (line) in the image sensor 103 from the first row to the Nth row successively in accordance with the timing signal (H signal in FIG. 9B) from the horizontal scan section 205. The read-out pixel signals are stored in the internal memory 105.

In the case where the condition 5 is satisfied, the readout mode 6 is driven (S37) and the pixel signals of the G pixels and the R pixels of the "right+left" image and the right image are acquired (S39). In the case where the condition 5 is satisfied, G (green) and B (blue) are predominant as the subject color information, and therefore, the phase difference detection is performed using the G pixel and the B pixel. Consequently, when reading out the pixels of the image sensor 103, as described at the second portion in FIG. 9B, in the odd-numbered rows (for example, the first row), the R pixels and the G pixels of the "right+left" image are read out and subsequently, the G pixels of the right image are read out. Then, in the even-numbered rows (for example, the second row), the G pixels and the B pixels of the "right+left" image are read out and the G pixels and the B pixels of the right image are read out. That is, the readout mode 6 performs an operation of reading out the pixel signals of the "right+left" image and the pixel signals of the G pixels of the right image and the B pixels of the right image for each pixel in one row (line) in the image sensor 103 from the first row to the Nth row successively in accordance with the timing signal (H signal in FIG. 9B) from the horizontal scan section 205. The read-out pixel signals are stored in the internal memory 105.

In the case where the condition 6 is satisfied, the readout mode 7 is driven (S41) and the pixel signals of the R pixels and the B pixels of the "right+left" image and the right image are acquired (S43). In the case where the condition 6 is satisfied, R (red) and B (blue) are predominant as the subject color information, and therefore, the phase difference detection is performed using the R pixel and the B pixel. Consequently, when reading out the pixels of the image sensor 103, as described at the third portion in FIG. 9B, in the odd-numbered rows (for example, the first row), the R pixels and the G pixels of the "right+left" image are read out and subsequently, the R pixels of the right image are read out. Then, in the even-numbered rows (for example, the second row), the G pixels and the B pixels of the "right+left" image are read out and the B pixels of the right image are read out. That is, the readout mode 7 performs an operation of reading out the pixel signals of the "right+left" image and the pixel signals of the R pixels of the right image and the B pixels of the right image for each pixel in one row (line) in the image sensor 103 from the first row to the Nth row successively in accordance with the timing signal (H signal in FIG. 9B) from the horizontal scan section 205. The read-out pixel signals are stored in the internal memory 105.

In the case where none of the conditions 1 to 6 is satisfied, the readout mode 1 is driven (S45) and the pixel signals of the R pixels, the G pixels, and the B pixels of the "right+left" image and the right image are acquired (S47). In the case where none of the conditions 1 to 6 is satisfied, there is no predominant color as the subject color information, and therefore, the phase difference detection is performed using three pixels of the R pixel, the G pixel, and the B pixel. Consequently, when reading out the pixels of the image sensor 103, as described at the first portion in FIG. 9A, in the odd-numbered rows (for example, the first row), the R pixels and the G pixels of the "right+left" image are read out and subsequently, the G pixels and the R pixels of the right image are read out. Then, in the even-numbered rows (for example, the second row), the G pixels and the B pixels of the "right+left" image are read out and the G pixels and the B pixels of the right image are read out. The read-out pixel signals are stored in the internal memory 105.

Figure 10:
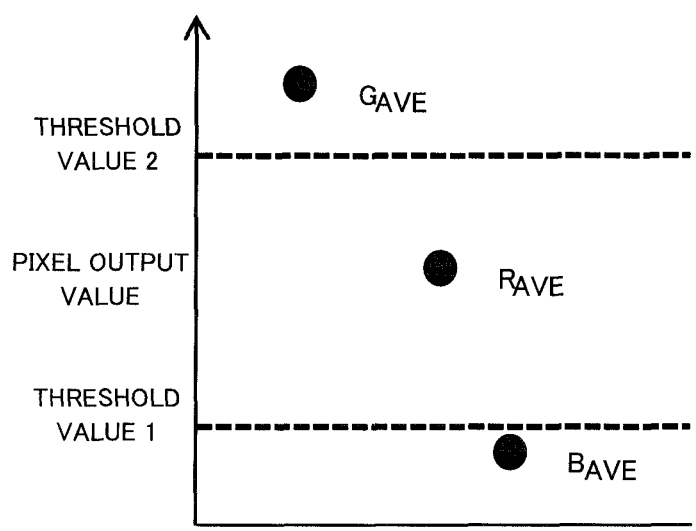
FIG. 10 is a graph showing a relationship between determination values used for color calculation processing in the imaging device according to the first embodiment of the present invention.

FIG. 10 is an image diagram in the case where the condition 1 is satisfied. The average value $G_{AVE}$ of the G pixel is larger than the threshold value 2, resulting in a possible saturation of the pixel value, and therefore is not appropriate for phase difference detection. Further, the average value $B_{AVE}$ of the B pixel is smaller than the threshold value 1, resulting in a too dark pixel value, and therefore is not appropriate for phase difference detection. In contrast, the average value $R_{AVE}$ of the R pixel is between the threshold value 1 and the threshold value 2 and is neither too dark nor too bright, and therefore, the pixel value of the R pixel is appropriate for phase difference detection.

Figure 8:
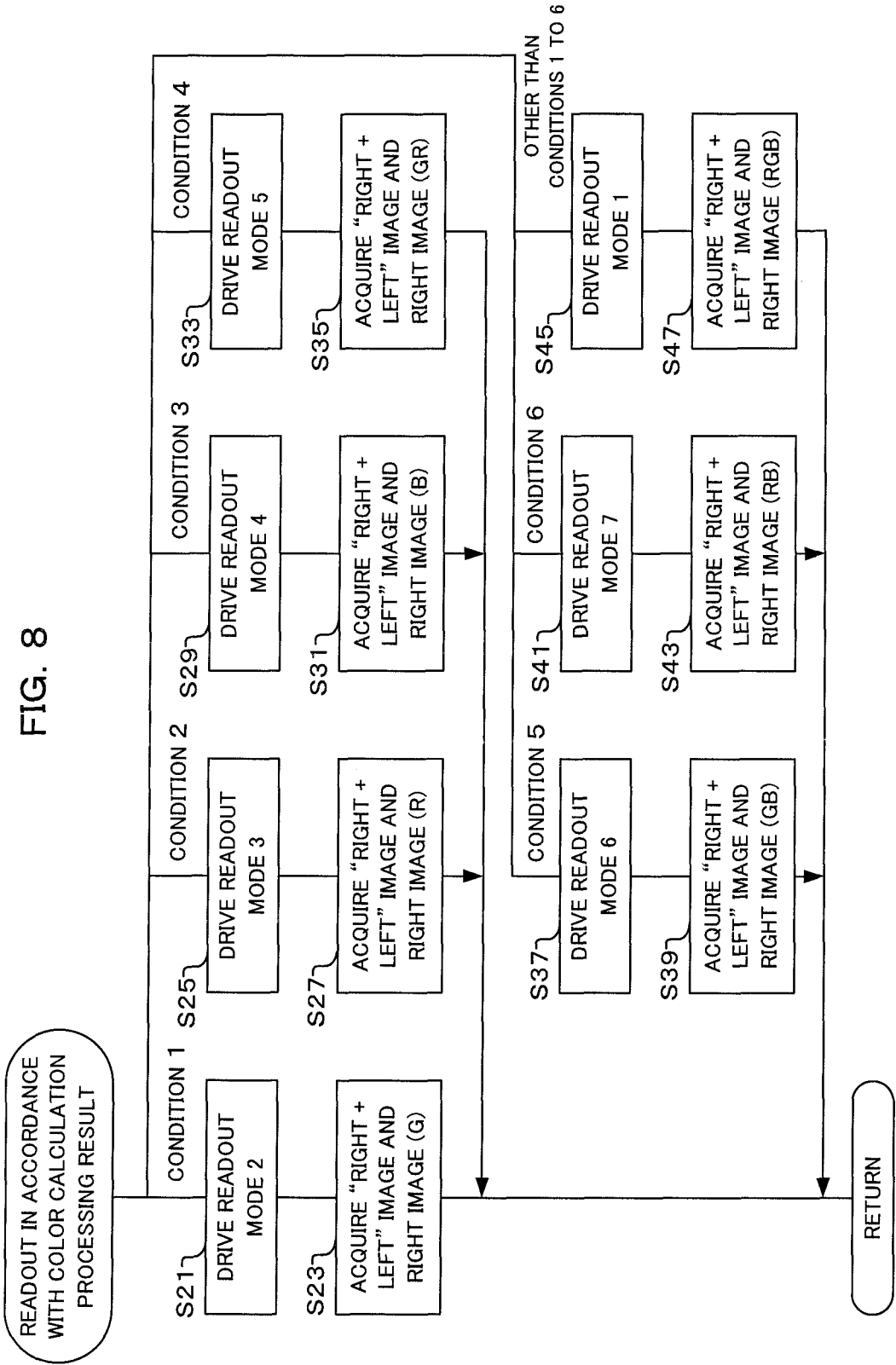
FIG. 8 is a flowchart showing a readout operation in accordance with a color calculation processing result of the imaging device according to the first embodiment of the present invention.

In the flows in FIG. 7 and FIG. 8, for example, in the case where the result at step S5 determines that pixels other than the R pixel are not appropriate for phase difference detection (in the case where the condition 2 is satisfied), the processing advances to step S25. The operation of the image sensor 103 at this time is the readout mode 3 shown at the third portion in FIG. 9A. In comparison with the readout mode 1, the readout of the right image is performed only for the R pixel, and therefore, it is known that the period of time during which no image is output lengthens. That is, the time during which the readout is performed actually from the image sensor 103 shortens, and therefore, the power-saving effect is obtained and power consumption is reduced.

Further, the phase difference detection image of the R pixel is always output, and therefore, the AF (autofocus) performance does not change and it is possible to guarantee the appearance in the live-view display.

As described above, in the first embodiment, in the imaging device including an image sensor in which one microlens includes a plurality of photodiodes, it is possible to guarantee the appearance in the live-view display without the change in AF performance while suppressing power consumption.

Further, in the present embodiment, the signal extraction section is provided which extracts the focus detection signals (for example, signals extracted by the right image extraction section 602) on the basis of the light fluxes having passed through the pupil area in one direction and the image signals (for example, signals extracted by the "right+left" image extraction section 601) on the basis of the light fluxes having passed through all the pupil areas from a plurality of pixels receiving the light fluxes having passed through different pupil areas, and the color information detection section detects color information on the basis of the image signals. Accordingly, it is possible to detect color information in accordance with the change states of all the images.

Next, a second embodiment of the present invention will be described referring to FIG. 11 to FIG. 13. In the first embodiment, color information is detected on the basis of the "right+left" image extracted by the "right+left" image extraction section 601. In contrast, in the second embodiment, color information is detected on the basis of the right image extracted by the right image extraction section 602 and the left image extracted by the left image extraction section 603.

Figure 6:
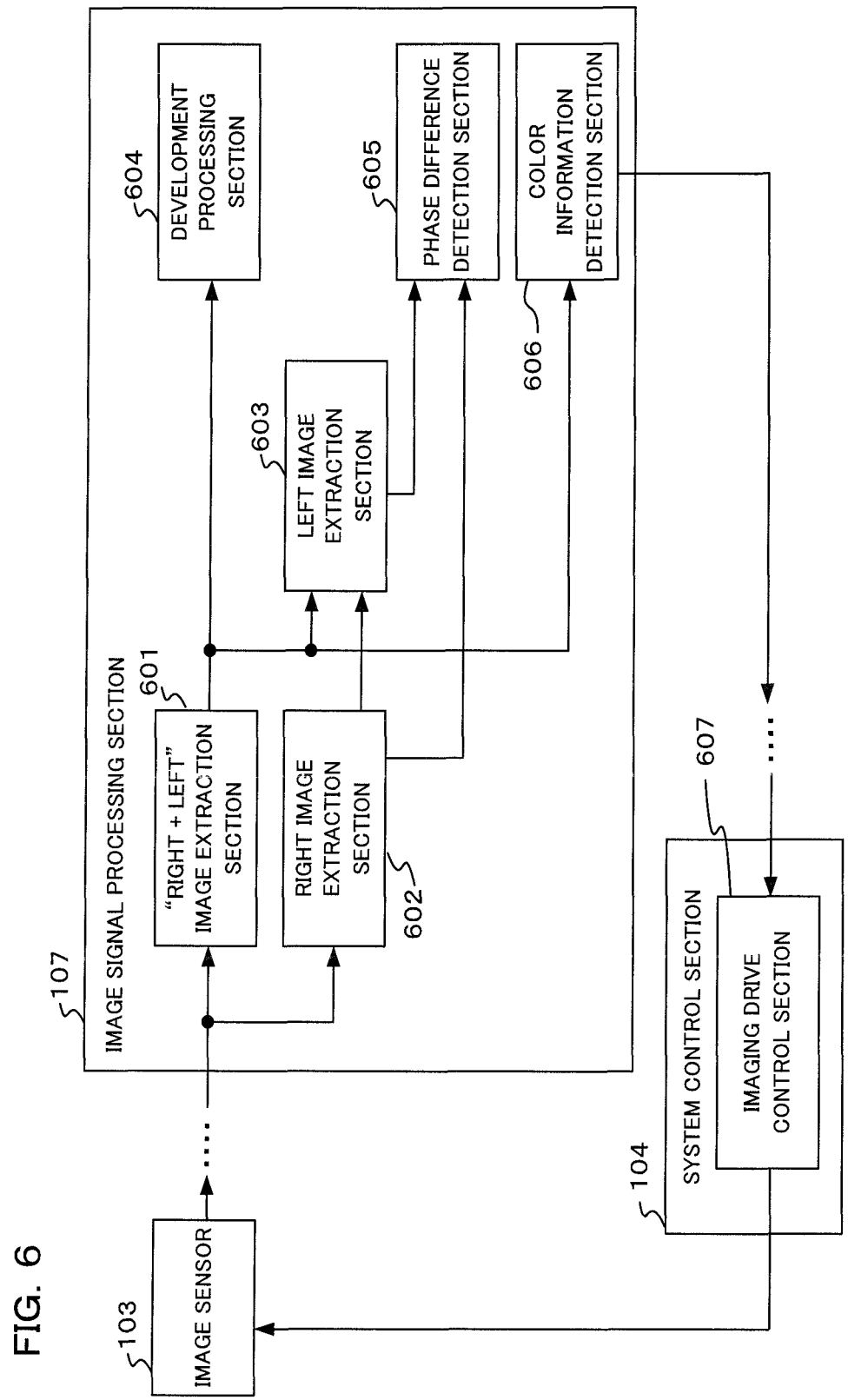
FIG. 6 is a block diagram showing the electrical structure of an image signal processing section and the periphery thereof in the imaging device according to the first embodiment of the present invention.
Figure 11:
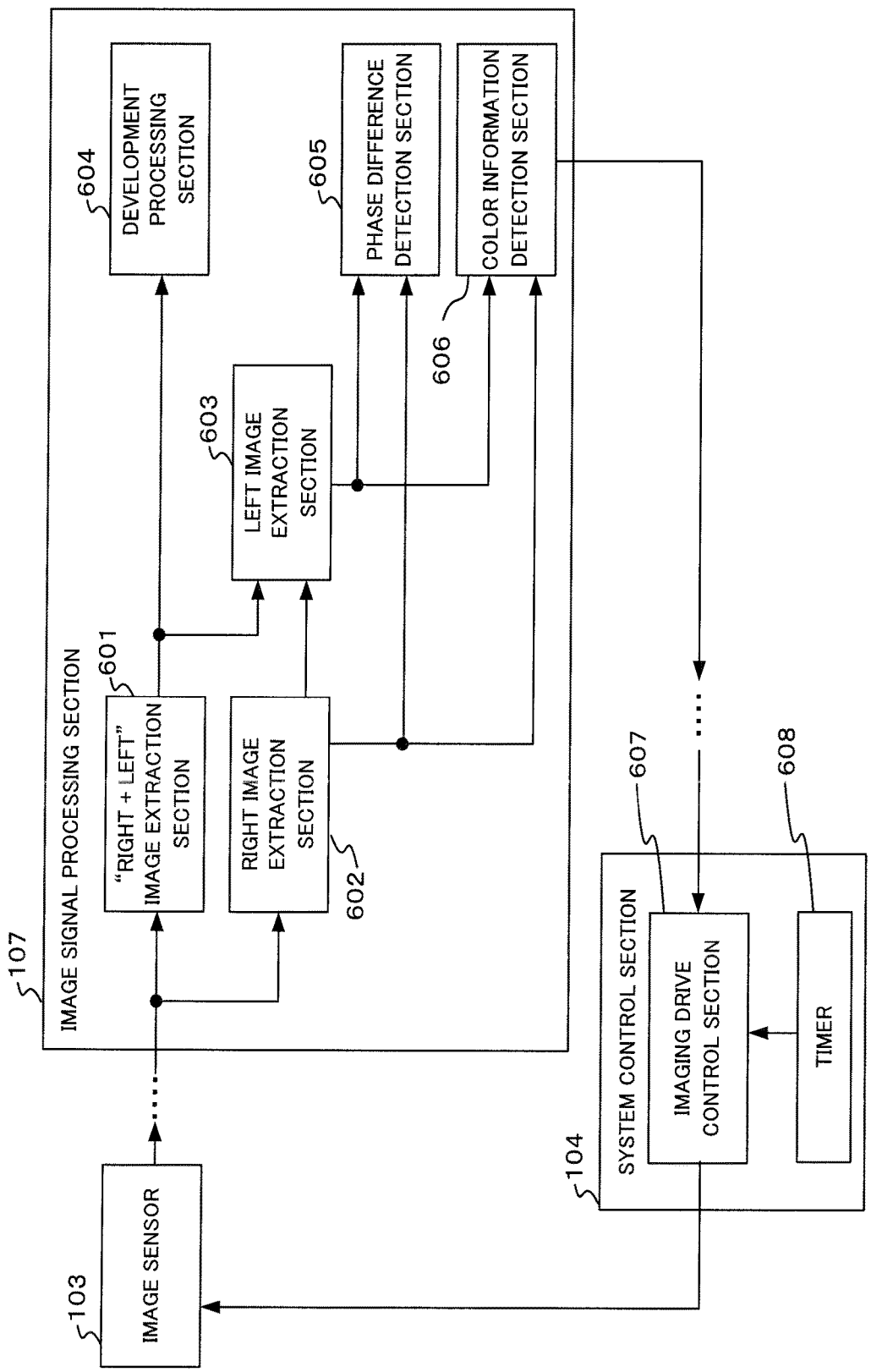
FIG. 11 is a block diagram showing the electrical structure of an image signal processing section and the periphery thereof in an imaging device according to a second embodiment of the present invention.
Figure 12:
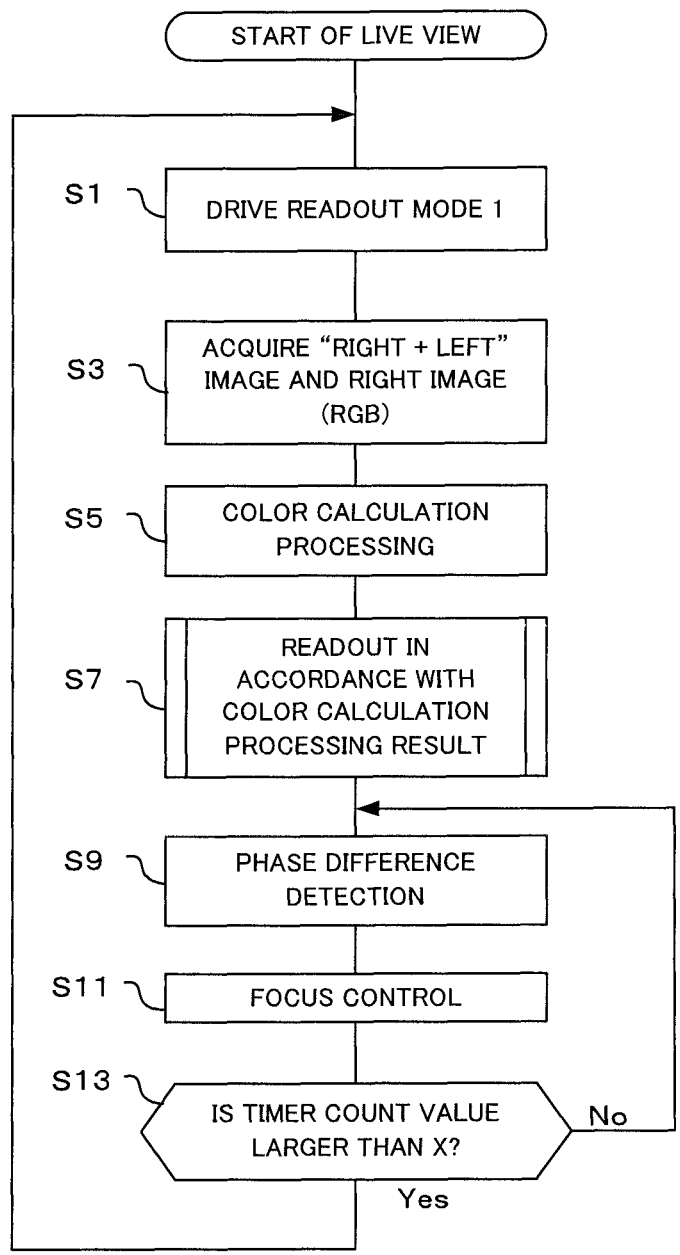
FIG. 12 is a flowchart showing a live-view operation of the imaging device according to the second embodiment of the present invention.
Figure 13:
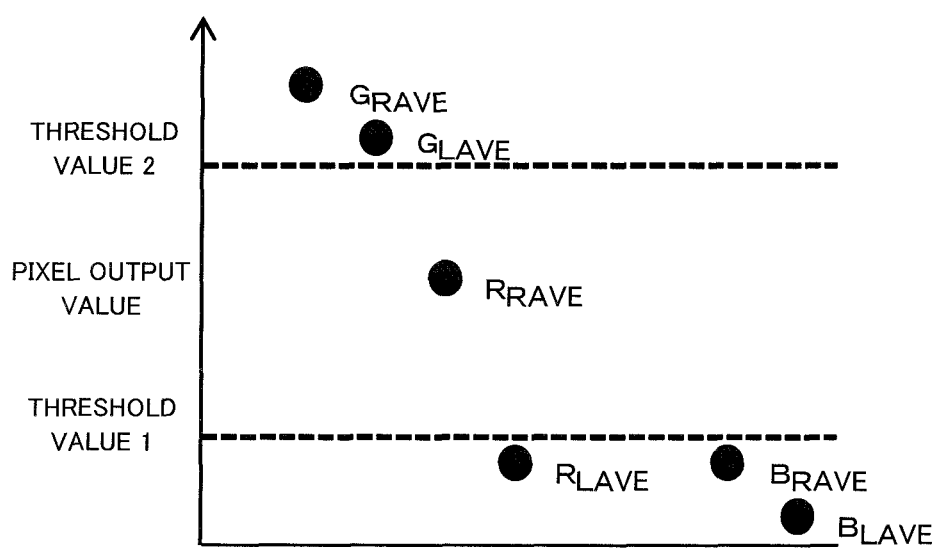
FIG. 13 is a graph showing a relationship between determination values used for color calculation processing in the imaging device according to the second embodiment of the present invention.

The configuration in the present embodiment is the same as that in FIG. 1 to FIG. 5 according to the first embodiment and the present embodiment is the same as the first embodiment except in that FIG. 6 is replaced with FIG. 11, the flowchart of the live-view operation shown in FIG. 7 is replaced with the flowchart shown in FIG. 12, and the relationship between threshold values shown in FIG. 10 is replaced with that in FIG. 13. Consequently, the different points from the first embodiment will be described mainly.

Using FIG. 11, the detailed configuration of the image signal processing section 107 in the present embodiment will be described. When FIG. 6 according to the first embodiment is compared with FIG. 11, it is known that the difference lays in that the color information calculation section 606 inputs the right image extracted from the right image extraction section 602 and the left image generated by the left image extraction section 603. Note that, in the second embodiment also, all of or apart of these sections may include hardware circuits. That is, these sections may include the "right+left" image extraction circuit, the right image extraction circuit, the left image extraction circuit, the development processing circuit, the phase difference detection circuit, the color information detection circuit and the like.

The color information detection section 606 calculates the output value for each color within the area on the specified image and outputs the detection result to the imaging drive control section 607 within the system control section 104 via the data bus 110 and the internal memory 105. Within the system control section 104, a timer 608 is provided and the timer 608 outputs a timer count value to the imaging drive control section 607. As will be described below, in the present embodiment, after a predetermined time has elapsed, the pixel signal is read out from the image sensor 103 by the readout mode 1. The timer count value is used to determine whether or not a predetermined time has elapsed (see S13 in FIG. 12).

Next, referring to FIG. 12, the live-view operation in the present embodiment will be described. In the present embodiment also, the flow shown in FIG. 12 is implemented by the CPU within the system control section 104 controlling each section within the imaging device 100 on the basis of programs stored in the internal memory 105. In comparison with FIG. 7 according to the first embodiment, the present embodiment differs in that the determination at step S11 is added. Further, the determination conditions to branch into the condition 1 to the condition 6 shown in FIG. 8 are different. Here, different points will be described mainly.

Before describing the flow in FIG. 12, the determination conditions to branch into the condition 1 to the condition 6 shown in FIG. 8 will be described. Note that the determination is performed in the color calculation processing at step S5 as in the first embodiment.

In the color calculation processing at step S5, the color information detection section 606 first detects the color of each area using the pixel signal of each image of the right image and the left image. In the detection, the colors (for example, $R_L$, $G_L$, $B_L$, $R_R$, $G_R$, $B_R$) are separated into each color in each of the right image and the left image and the pixel outputs for each color in a fixed area (for example, AF calculation area) are averaged. Here, in addition to the averaging calculation, an added value of pixels within an area or the most frequently output pixel value may be used. In the first embodiment, the color of each area is detected using the "right+left" image, but in the second embodiment, the color of each area is detected for the right image and the left image, respectively.

Next, the conditions at the time of the determination at step S5 will be described. Note that $R_{LAVE}$ is the average value of the pixel outputs for each area of the R pixel of the left image, $G_{LAVE}$ is the average value of the pixel outputs for each area of the G pixel of the left image, and $B_{LAVE}$ is the average value of the pixel outputs for each area of the B pixel of the left image. Further, $R_{RAVE}$ is the average value of the pixel outputs for each area of the R pixel of the right image, $G_{RAVE}$ is the average value of the pixel outputs for each area of the G pixel of the right image, and $B_{RAVE}$ is the average value of the pixel outputs for each area of the B pixel of the right image. Here, there is a relationship of the threshold value 1 < the threshold value 2 (see FIG. 13).

(Condition 1)
In the case where
$G_{LAVE}$>threshold value 1 and $G_{LAVE}$<threshold value 2 and
or $G_{RAVE}$>threshold value 1 and $G_{RAVE}$<threshold value 2 and
$R_{LAVE}$<threshold value 1 or $R_{LAVE}$>threshold value 2 and
$R_{RAVE}$<threshold value 1 or $R_{RAVE}$>threshold value 2 and
$B_{LAVE}$<threshold value 1 or $B_{LAVE}$>threshold value 2 and
$B_{RAVE}$<threshold value 1 or $B_{RAVE}$>threshold value 2
are satisfied, the processing advances to step S21 (condition 1).

(Condition 2)
In the case where $G_{LAVE}$<threshold value 1 or $G_{LAVE}$>threshold value 2 and
$G_{RAVE}$<threshold value 1 or $G_{RAVE}$>threshold value 2 and
$R_{LAVE}$>threshold value 1 and $R_{LAVE}$<threshold value 2 and
or $R_{RAVE}$>threshold value 1 and $R_{RAVE}$<threshold value 2 and
$B_{LAVE}$<threshold value 1 or $B_{LAVE}$>threshold value 2 and
$B_{RAVE}$<threshold value 1 or $B_{RAVE}$>threshold value 2
are satisfied, the processing advances to step S25 (condition 2).

(Condition 3)
In the case where
$G_{LAVE}$<threshold value 1 or $G_{LAVE}$<threshold value 2 and
$G_{RAVE}$<threshold value 1 or $G_{RAVE}$<threshold value 2 and
$R_{LAVE}$<threshold value 1 or $R_{LAVE}$>threshold value 2 and
$R_{RAVE}$<threshold value 1 or $R_{RAVE}$>threshold value 2 and
$B_{LAVE}$>threshold value 1 and $B_{LAVE}$<threshold value 2 and
or $B_{RAVE}$>threshold value 1 and $B_{RAVE}$<threshold value 2
are satisfied, the processing advances to step S29 (condition 3).

(Condition 4)
In the case where
$G_{LAVE}$>threshold value 1 and $G_{LAVE}$<threshold value 2 and
or $G_{RAVE}$>threshold value 1 and $G_{RAVE}$<threshold value 2 and
$R_{LAVE}$>threshold value 1 and $R_{LAVE}$<threshold value 2 and
or $R_{RAVE}$>threshold value 1 and $R_{RAVE}$<threshold value 2 and
$B_{LAVE}$<threshold value 1 or $B_{LAVE}$>threshold value 2 and
$B_{RAVE}$<threshold value 1 or $B_{RAVE}$>threshold value 2
are satisfied, the processing advances to step S33 (condition 4).

(Condition 5)
In the case where
$G_{LAVE}$>threshold value 1 and $G_{LAVE}$<threshold value 2 and
or $G_{RAVE}$>threshold value 1 and $G_{RAVE}$<threshold value 2 and
$R_{LAVE}$<threshold value 1 or $R_{LAVE}$>threshold value 2 and
$R_{RAVE}$<threshold value 1 or $R_{RAVE}$>threshold value 2 and
$B_{LAVE}$>threshold value 1 and $B_{LAVE}$<threshold value 2 and
or $B_{RAVE}$>threshold value 1 and $B_{RAVE}$<threshold value 2
are satisfied, the processing advances to step S37 (condition 5).

(Condition 6)

In the case where $G_{LAVE}$>threshold value 1 and $G_{LAVE}$<threshold value 2 and or $G_{RAVE}$>threshold value 1 and $G_{RAVE}$<threshold value 2 and $R_{LAVE}$>threshold value 1 and $R_{LAVE}$<threshold value 2 and or $R_{RAVE}$>threshold value 1 and $R_{RAVE}$<threshold value 2 and $B_{LAVE}$>threshold value 1 and $B_{LAVE}$<threshold value 2 and or $B_{RAVE}$>threshold value 1 and $B_{RAVE}$<threshold value 2 are satisfied, the processing advances to step S41 (condition 6)

In the case where none of the above-described conditions 1 to 6 is satisfied, the processing advances to step S45. Driving of the readout under each of the conditions is the same as that in FIG. 8, FIG. 9A and FIG. 9B, and therefore, detailed description is omitted.

FIG. 13 is an image diagram in the case where the condition 1 is satisfied. The average values $G_{RAVE}$ and $G_{LAVE}$ of the G pixels of the right image and the left image are larger than the threshold value 2, resulting in a possible saturation of the pixel value, and therefore is not appropriate for phase difference detection. Further, the average values $B_{RAVE}$ and $B_{LAVE}$ of the B pixels of the right image and the left image and the average value $R_{LAVE}$ of the R pixels of the left image is smaller than the threshold value 1, resulting in a too dark pixel value, and therefore is not appropriate for phase difference detection. In contrast, the average value $R_{RAVE}$ of the R pixels of the right image is between the threshold value 1 and the threshold value 2, and the pixel value is neither too dark nor too bright, and therefore, appropriate for phase difference detection. Here, it is assumed that the threshold value 1 and the threshold value 2 are fixed for each color in the right image and the left image, but it may also be possible to change the threshold value for each color.

Next, the live-view operation shown in FIG. 12 will be described. The start of the live-view operation and steps S1 to S11 are the same as those of the first embodiment. After the focus control is performed at step S11, it is next determined whether or not the timer count value exceeds X (S13). Here, it is determined whether or not the timer count value counted by the timer 608 is larger than X (X is a constant). Note that it is only required for X to be a time long enough to determine whether or not the scene has changed.

In the case where the result of the determination at step S13 indicates that the timer count value is not larger than X, the processing advances to step S9. In the second embodiment also, at each time determined by a predetermined frame rate, the pixel signal is read out from the image sensor 103. After the pixel signal is read out, the phase difference detection and the focus control are performed. In the first embodiment, for each frame, the color calculation processing is performed at step S5 and the pixel signal is read out on the basis of the predominant the subject color information. However, in the present embodiment, the processing is not performed for each frame and on the basis of the predominant color information detected at step S5, the image signal is read out.

On the other hand, in the case where the result of the determination at step S13 indicates that the timer count value is larger than X, the processing advances to step S1.

In this case, the pixel signal is read out by the readout mode 1 at step S1 and the step S3 and subsequent steps are performed.

As described above, in this flow, when the timer count value is smaller than X, the color calculation processing is not performed and when the timer count value becomes larger than X, the color calculation processing is performed. That is, in this flow, the readout period of the signal by the pixel signal readout section is made variable. Accordingly, in the present embodiment, the color calculation processing is not performed for each frame, and therefore, it is possible to reduce power consumption. However, there is a case where the scene of a subject changes, and therefore, the flow is designed so that when the timer indicates that a predetermined time has elapsed, the processing returns to the color calculation processing again.

Further, in the present embodiment the signal extraction section is provided which extracts, using the focus detection signals (for example, signals extracted by the right image extraction section 602) on the basis of the light fluxes having passed through the pupil area in one direction and the image signals (for example, signals extracted by the "right+left" image extraction section 601) on the basis of the light fluxes having passed through all the pupil areas, the focus detection signals (for example, signals extracted by the left image extraction section 603) on the basis of the direction different from the above-described one direction from a plurality of pixels receiving the light fluxes having passed through different pupil areas, and the color information detection section (for example, the color information detection section 606) detects the above-described color information on the basis of the focus detection signals on the basis of the light fluxes having passed through the pupil area in one direction and the focus detection signals on the basis of the direction different from the one direction. Accordingly, it is possible to obtain the same signal components as those of the well-known phase difference detection method used by the phase difference detection section 605, and therefore, it is possible to increase the required accuracy of a color.

Note that, in the present embodiment, when the predetermined time X has elapsed, the processing returns to step S1 and the color calculation processing is performed at step S5. However, the flow is not limited thereto and it may also be possible to determine whether or not the imaging device has moved by a predetermined amount or more with a gyroscope or the like and to perform the color calculation processing in the case where the imaging device has moved by a predetermined amount or more, or in the case where the subject luminance is detected on the basis of the pixel signal from the image sensor 103 and the subject luminance has changed by a predetermined amount or more.

As described above, in each embodiment of the present invention, the focus detection signals are readout (for example, S1 and S3 in FIG. 7) from the pixel group of the image sensor 103, the subject color information is detected (S5 in FIG. 7) on the basis of the read-out focus detection signals, and only the signals of the unit pixel in correspondence with the color filter associated with the detected the subject color information are read out (S7 in FIG. 7). When reading out the pixel group, the signals in correspondence with the color filter associated with the predominant the subject color information are read and the signals in correspondence with the color filter associated with the non-predominant color information are not read out, and therefore, it is possible to reduce the number of times of readout from the pixel and to reduce power consumption. Further, it is possible to perform phase difference AF from the focus detection signal that is necessary, and therefore, the AF performance does not degrade and the live-view image does not become unsightly.

Note that, in each embodiment of the present invention, after the "right+left" image corresponding to one row is read out, the right image corresponding to one row is read out. However, the readout order is not limited thereto and the readout order may be changed as appropriate and for example, it may also be possible to read out, after reading out the "right+left" image and the right image, the "right+left" image and the right image adjacent thereto for each pixel. Further, in each embodiment, the "right+left" image and the right image are read out. However, this is not limiting and for example, it may also be possible to read out the "right+left" image and the left image. Further, it may also be possible to read out the right image and the left image and to generate the combined "right+left" image from both the images. Furthermore, in each embodiment of the present invention, at the time of the detection in the color information calculation (S5 in FIG. 7 and FIG. 12), one, two, or three colors are detected as the predominant color(s) of the subject. However, this is not limiting and it may also be possible to detect only one color or, when there are more than one color, select one of the colors.

Further, in each embodiment of the present invention, the "right+left" image extraction section 601, the right image extraction section 602, the left image extraction section 603, the development processing section 604, the phase difference detection section 605, and the color information detection section 606 are provided within the image signal processing section 107. However, this is not limiting and it may also be possible to perform the functions of a part or all of the sections by the CPU within the system control section 104 in a software manner, or by the peripheral circuits within the system control section 104.

Further, the inside of the image signal processing section 107 may be a hardware configuration of a gate circuit and the like generated on the basis of the programming language described in Verilog, or a hardware configuration that uses software such as a DSP (Digital Signal Processor) and the like, in addition to configuring the entire image signal processing section 107 by hardware circuits. It is needless to say that it may also be possible to combine the aforementioned components as appropriate.

Further, in the present embodiment, explanation is given using a digital camera as an imaging device, but as a camera, a digital single-lens reflex camera or a compact digital camera may be used, or a camera for a moving image, such as a video camera and a movie camera, may be used, and furthermore, a camera may also be a camera incorporated into a mobile phone, a smartphone, a mobile information terminal, a personal computer (PC), a tablet type computer, a game device or the like. In any case, the present invention can be applied to any device for photographing which performs phase difference AF.

Also, among the technology that has been described in this specification, with respect to control that has been described mainly using flowcharts, there are many instances where setting is possible using programs, and such programs may be held in a storage medium or storage section. The manner of storing the programs in the storage medium or storage section may be to store at the time of manufacture, or by using a distributed storage medium, or they be downloaded via the Internet.

Also, regarding the operation flow in the patent claims, the specification and the drawings, for the sake of convenience description has been given using words representing sequence, such as "first" and "next", but at places where it is not particularly described, this does not mean that implementation must be in this order.

As understood by those having ordinary skill in the art, as used in this application, 'section,' 'unit,' 'component,' 'element,' 'module,' 'device,' 'member,' 'mechanism,' 'apparatus,' 'machine,' or 'system' may be implemented as circuitry, such as integrated circuits, application specific circuits ("ASICs"), field programmable logic arrays ("FPLAs"), etc., and/or software implemented on a processor, such as a microprocessor.

The present invention is not limited to these embodiments, and structural elements may be modified in actual implementation within the scope of the gist of the embodiments. It is also possible form various inventions by suitably combining the plurality structural elements disclosed in the above described embodiments. For example, it is possible to omit some of the structural elements shown in the embodiments. It is also possible to suitably combine structural elements from different embodiments.

What is claimed is:

1. An imaging device, comprising:
a pixel group in which unit pixels including a plurality of pixels receiving light fluxes having passed through different pupil areas of a photographing lens are provided in a form of a matrix;
a plurality of types of color filters with different spectral transmittances provided in correspondence with the unit pixels;
a microlens provided in correspondence with the color filter;
a color information detection circuit which detects subject color information; and
a pixel signal readout circuit which reads out a focus detection signal from the pixel group and reads out only a signal of the unit pixel in correspondence with a color filter associated with subject color information detected by the color information detection circuit.

2. The imaging device of claim 1, wherein
the pixel signal readout circuit reads out an image signal and a focus detection signal from the pixel group and reads out a signal of the unit pixel in correspondence with a color filter in accordance with the image signal and subject color information detected by the color information detection circuit.

3. The imaging device of claim 2, wherein
the pixel signal readout circuit reads out all signals of the plurality of pixels from the unit pixel as the image signal and when reading out the focus detection signal, reads out only a signal of the unit pixel in correspondence with a color filter associated with subject color information detected by the color information detection circuit.

4. The imaging device of claim 1, wherein
the pixel signal readout circuit performs readout while varying a readout period of a signal of the unit pixel.

5. The imaging device of claim 1, further comprising:
a signal extraction circuit which extract a focus detection signal on a basis of a light flux having passed through a pupil area in one direction and an image signal on a basis of a light flux having passed through all pupil areas from a plurality of pixels receiving light fluxes having passed through the different pupil areas, wherein
the color information detection circuit detects the color information on a basis of the image signal.

6. The imaging device of claim 1, further comprising:
a signal extraction circuit which extracts, using a focus detection signal on a basis of a light flux having passed through a pupil area in one direction and an image signal on a basis of a light flux having passed through all pupil areas, a focus detection signal based a direction different from the one direction from a plurality of pixels receiving light fluxes having passed through the different pupil areas, wherein
the color information detection circuit detects the color information on a basis of the focus detection signal on a basis of a light flux having passed through a pupil area in one direction and the focus detection signal on a basis of a direction different from the one direction.

7. An imaging method of an imaging device having a pixel group in which unit pixels including a plurality of pixels receiving light fluxes having passed through different pupil areas of a photographing lens are provided in a form of a matrix, a plurality of types of color filters with different spectral transmittances provided in correspondence with the unit pixels, and a microlens provided in correspondence with the color filter, comprising:
reading out a focus detection signal from the pixel group;
detecting subject color information on a basis of the focus detection signal; and
reading out only a signal of the unit pixel in correspondence with a color filter, in accordance with the detected subject color information.

* * * * *